(12) United States Patent
Park et al.

(10) Patent No.: US 8,154,924 B2
(45) Date of Patent: Apr. 10, 2012

(54) NONVOLATILE MEMORY DEVICE AND READ METHOD

(75) Inventors: Kitae Park, Seongnam-si (KR); Myoung Gon Kang, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 197 days.

(21) Appl. No.: 12/506,345

(22) Filed: Jul. 21, 2009

(65) Prior Publication Data

US 2010/0039861 A1 Feb. 18, 2010

(30) Foreign Application Priority Data

Aug. 14, 2008 (KR) .................. 10-2008-0080059

(51) Int. Cl.
*G11C 11/34* (2006.01)

(52) U.S. Cl. ......... 365/185.05; 365/185.11; 365/185.18; 365/185.25

(58) Field of Classification Search ............. 365/185.05, 365/185.18, 185.11, 185.25
See application file for complete search history.

(56) References Cited

U.S. PATENT DOCUMENTS

| 5,923,587 | A * | 7/1999 | Choi | 365/185.11 |
| 6,996,003 | B2 * | 2/2006 | Li et al. | 365/185.02 |
| 2006/0152981 | A1 | 7/2006 | Ryu | |
| 2008/0094927 | A1 * | 4/2008 | Kim | 365/204 |

FOREIGN PATENT DOCUMENTS

| KR | 100170708 B1 | 10/1998 |
| KR | 100206709 B1 | 4/1999 |
| KR | 1020020056208 A | 7/2002 |

* cited by examiner

*Primary Examiner* — Son Dinh
(74) *Attorney, Agent, or Firm* — Volentine & Whitt, PLLC

(57) ABSTRACT

Disclosed is a nonvolatile memory including a memory cell array including a first cell string connected between a first bit line and a first common source line, and a second cell string a second common source line and a second bit line adjacent to the first bit line. The nonvolatile memory also includes a control logic circuit configured to independently control the first and second common source lines.

10 Claims, 16 Drawing Sheets

NONVOLATILE MEMORY DEVICE AND READ METHOD

CROSS-REFERENCE TO RELATED APPLICATION

This U.S. non-provisional patent application claims priority under 35 U.S.C. §119 to Korean Patent Application No. 10-2008-0080059 filed on Aug. 14, 2008, the subject matter of which is hereby incorporated by reference.

BACKGROUND

The present invention relates to memory devices. More particularly, the invention relates to nonvolatile memory devices and read methods providing immunity from read disturbances.

Error detection and/or correction (ECC) schemes allow the recovery and restoration of data including one or more defective data bits. Errors are introduced into data via a number of different mechanisms during transfer, storage, and retrieval.

Many different ECC schemes have been used in variety of data storage and communication systems. Well-known ECC techniques include various coding schemes such as Reed-Solomon (RS), Hamming, Bose-Chaudhur-Hocquenghem (BCH), cyclic redundancy (CRC), and so forth. Using one or more of these ECC techniques, much defective data may be successfully identified and repaired.

In many contemporary data processing and storage systems, so-called "payload data"—the data having the desired information component—is stored in nonvolatile memory along with other data dedicated to the error detection and/or correction. This type of collateral data is commonly referred to as ECC data and is derived from the payload data. Once stored with the payload data, ECC data may be used to correct errant data bits generated during a read operation directed to the nonvolatile memory. The nature and quantity of the ECC data defines the actual number of errant data bits that may be corrected. By employing a competent ECC technique and coincidentally storing ECC data, many bit errors associated with read operations may be quickly and efficiently repaired without the need to use more onerous remedies such as block replacement.

SUMMARY

Embodiments of the present invention are directed to semiconductor memory devices and related read methods that identify and correct bits errors in data read from nonvolatile memory. Embodiments of the invention are more particularly directed to the prevention of bit errors arising from read disturbances and include both device embodiments and method embodiments. Embodiments of the invention are also directed to a memory system including a nonvolatile memory device capable of providing read data that is free from bit errors caused by a read disturbance while repeatedly reading a specific page.

In one aspect, the invention provides a nonvolatile memory device comprising; a memory cell array including a first cell string connected between a first bit line and a first common source line, and a second cell string a second common source line and a second bit line adjacent to the first bit line, and a control logic circuit configured to independently control the first and second common source lines.

In a related aspect, the control logic circuit is further configured to apply a predetermined voltage to the second common source line while reading a memory cell connected to the first cell string.

In another related aspect, the first cell string is an even cell string and the second cell string is an odd cell string.

In another related aspect, the nonvolatile memory device further comprises; a first ground selection transistor associated with the first cell string and having a source connected to the first common source line, and a second ground selection transistor associated with the second cell string and having a source connected to the second common source line.

In another related aspect, during a read operation directed to a selected memory cell connected to a selected word line of the first cell string, a ground voltage is applied to the first common source line and a predetermined voltage is applied to the second common source line.

In another related aspect, during a read operation directed to a selected memory cell connected to a selected word line of the second cell string, a ground voltage is applied to the second common source line and a predetermined voltage is applied to the first common source line.

In another related aspect, the memory cell array comprises a plurality of memory blocks, wherein each memory block includes the first and second common source lines, and during a read operation directed to a selected memory cell of the first cell string in a first memory block in the plurality of memory blocks, the first common source line of the first memory block is connected to the first common source line of remaining memory blocks, other than the first memory block, in the plurality of memory blocks.

In another aspect, the invention provides a read method for a nonvolatile memory device including: a memory cell array having a plurality of memory blocks, each memory block including a first cell string connected between a first bit line and a first common source line, and a second cell string a second common source line and a second bit line adjacent to the first bit line, wherein the nonvolatile memory device also includes a control logic circuit configured to independently control the first and second common source lines, the method comprising; applying a ground voltage to the first common source line, applying a predetermined voltage to the second common source line during a read operation directed to a selected memory cell of the first cell string in a selected first memory block of the plurality of memory blocks, and connecting the first common source line of the selected first memory block to the first common source line of remaining memory block, other than the first memory block, in the plurality of memory blocks.

BRIEF DESCRIPTION OF THE FIGURES

Non-limiting and non-exhaustive embodiments of the invention will now be described with reference to the accompanying drawings. In the drawings, like reference numbers and labels are used to denote like or similar elements and features, unless otherwise specified. In the drawings.

DESCRIPTION OF EMBODIMENTS

Embodiments of the invention will now be described in some additional detail with reference to the accompanying drawings. The invention may, however, be embodied in different forms and should not be constructed as being limited to only the illustrated embodiments. Rather, these embodiments are presented as teaching examples.

Figure 1:
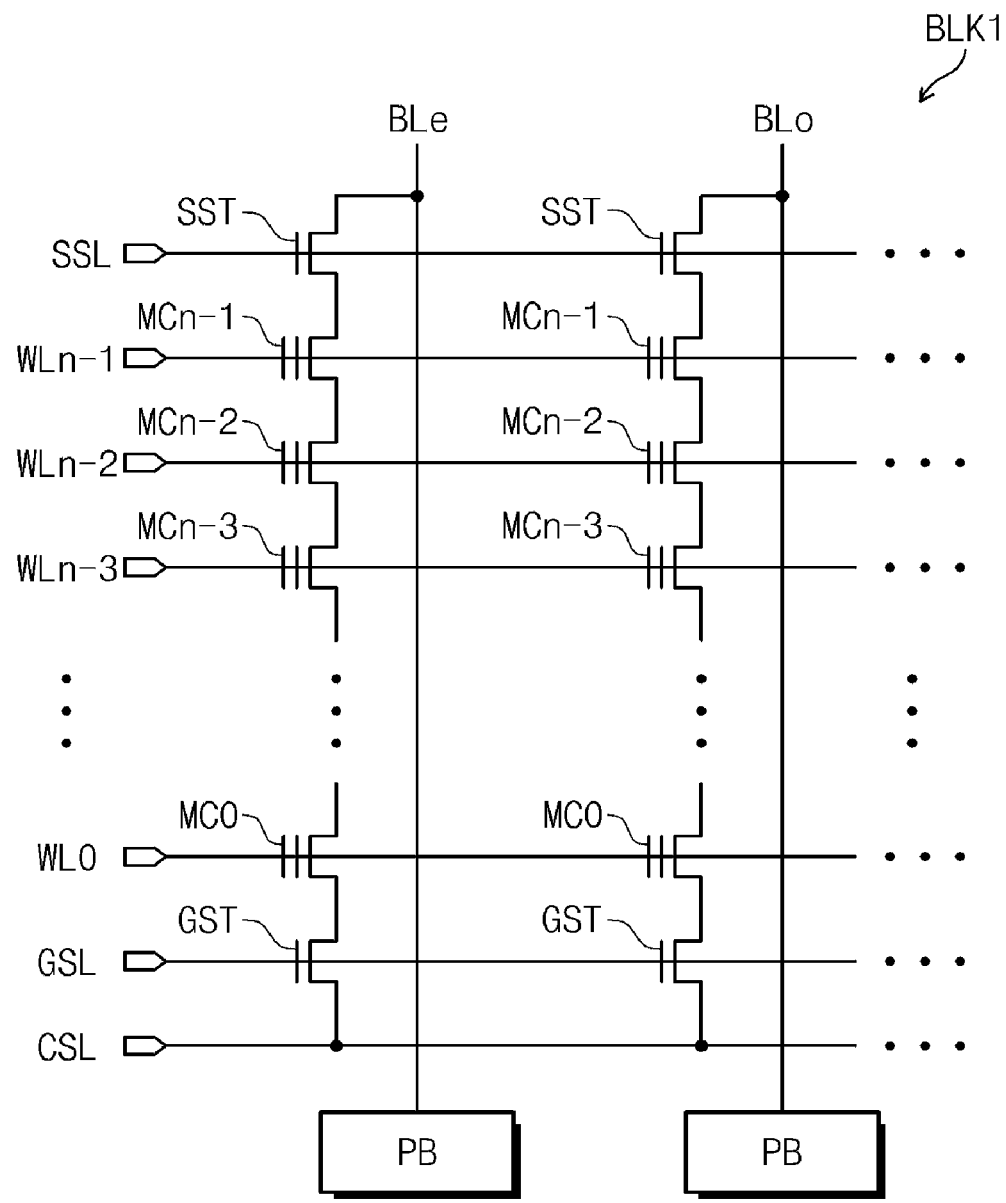
FIG. 1 is a partial circuit diagram of a conventional flash memory device.
Figure 2:
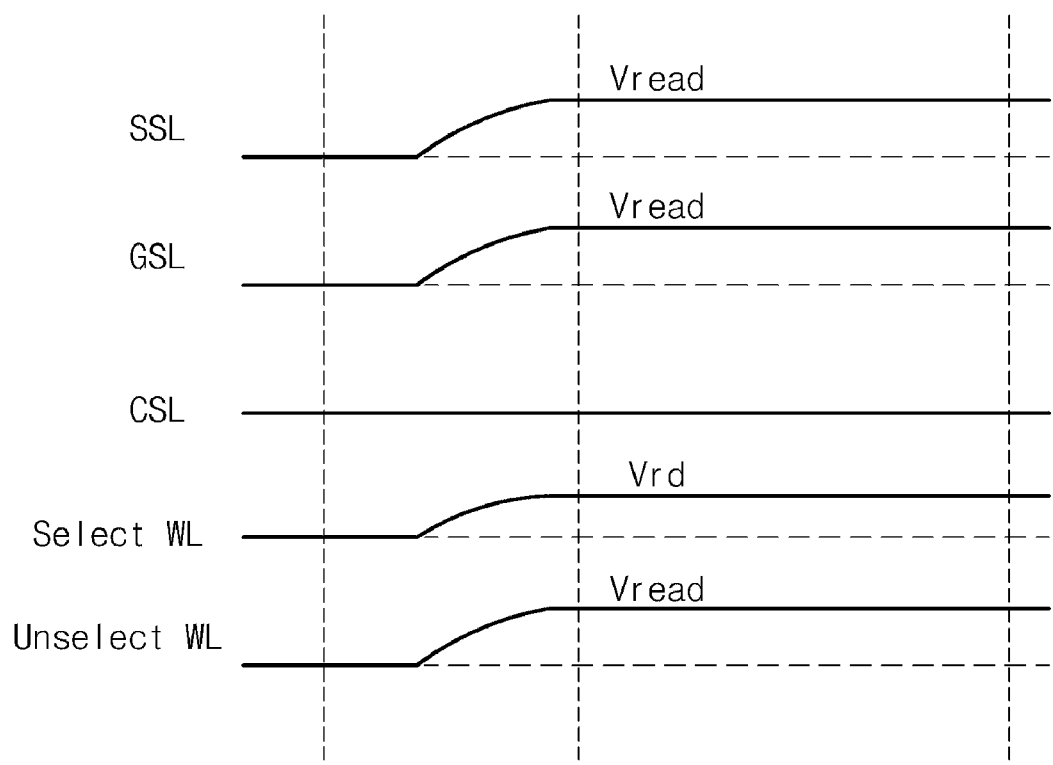
FIG. 2 is a timing diagram for a read operation of the flash memory device shown in FIG. 1.

A conceptual background for the present invention is now set forth in the context of certain conventional examples. Flash memory devices and related read methods are used as teaching examples, and are indicative of embodiments of the invention incorporating other forms of nonvolatile memory. Thus, Figure (FIG.) 1 is a partial circuit diagram of a conventional flash memory device, and FIG. 2 is a related timing diagram for a read operation performed on the flash memory device of FIG. 1.

As is well understood in the art, flash memory includes a memory cell array formed by a plurality of memory cells arranged in a number of memory blocks. Only a single memory block (e.g., BLK0) is illustrated in FIG. 1 as an example. The memory block BLK0 includes a plurality of memory cell strings (or NAND strings in the illustrated example) respectively connected to a corresponding bit line. Each NAND string includes a string selection transistor SST, a ground selection transistor GST, and a plurality of memory cells, each having a constituent cell transistors, MC0~MCn-1, connected in series between the string and ground selection transistors SST and GST.

The gates of the string and ground selection transistors SST and GST are coupled to string and ground selection lines SSL and GSL respectively. Control gates of the cell transistors MC0~MCn-1 are coupled to respective word lines WL0~WLm-1. Bit lines BL1 and BL2 (or BLe and BLo) are respectively connected to page buffers PB.

Those skilled in the art understand that memory cells may be single bit memory cells storing a single bit of data, or multi-bit memory cells storing 2 or more bits of data. Of note, certain embodiments of the present invention incorporate multi-bit memory cells.

During the exemplary read operation illustrated by the timing diagram of FIG. 2, a selected word line (e.g., WL0) is driven with a selective read voltage Vrd while unselected word lines (e.g., WL1~WLn-1) are driven with a non-selective read voltage Vread. At this time, the string and ground selection lines SSL and GSL are also driven with the non-selective read voltage Vread. The page buffers PB supply sensing currents to their corresponding bit lines BL1 and BL2 (or BLe and BLo).

Voltages apparent on the bit lines BL0~BLm-1 identify the programmed state of the memory cells coupled to the selected word line WL0. For instance, if a memory cell coupled to the selected word line has an ON-state, the voltage apparent on its corresponding bit line falls. If a memory cell coupled to the selected word line has an OFF-state, the voltage apparent on its corresponding bit line rises. These corresponding bit line voltages are sensed as cell data by the page buffers PB. For convenience of description, a memory cell coupled to an unselected word line will be referred to as 'unselected memory cell' and a memory cell coupled to a selected word line will be referred to as 'selected memory cell'.

As aforementioned, to read data from a selected memory cell, the non-selective read voltage Vread is applied to word lines coupled to unselected memory cells. Here, the non-selective read voltage Vread applied to the unselected word lines has a level sufficient to turn-on cell transistors currently having an OFF-cell state.

During a read operation, the selective read voltage is applied to the control gates of unselected cell transistors. Ground voltage is applied to the substrate portion (or bulk) containing the unselected cell transistors, and the drains of the unselected cell transistors are charged to a predetermined voltage. Under these conditions, a bias condition similar to the bias condition of a programming operation is obtained albeit at a difference voltage level.

Figure 3:
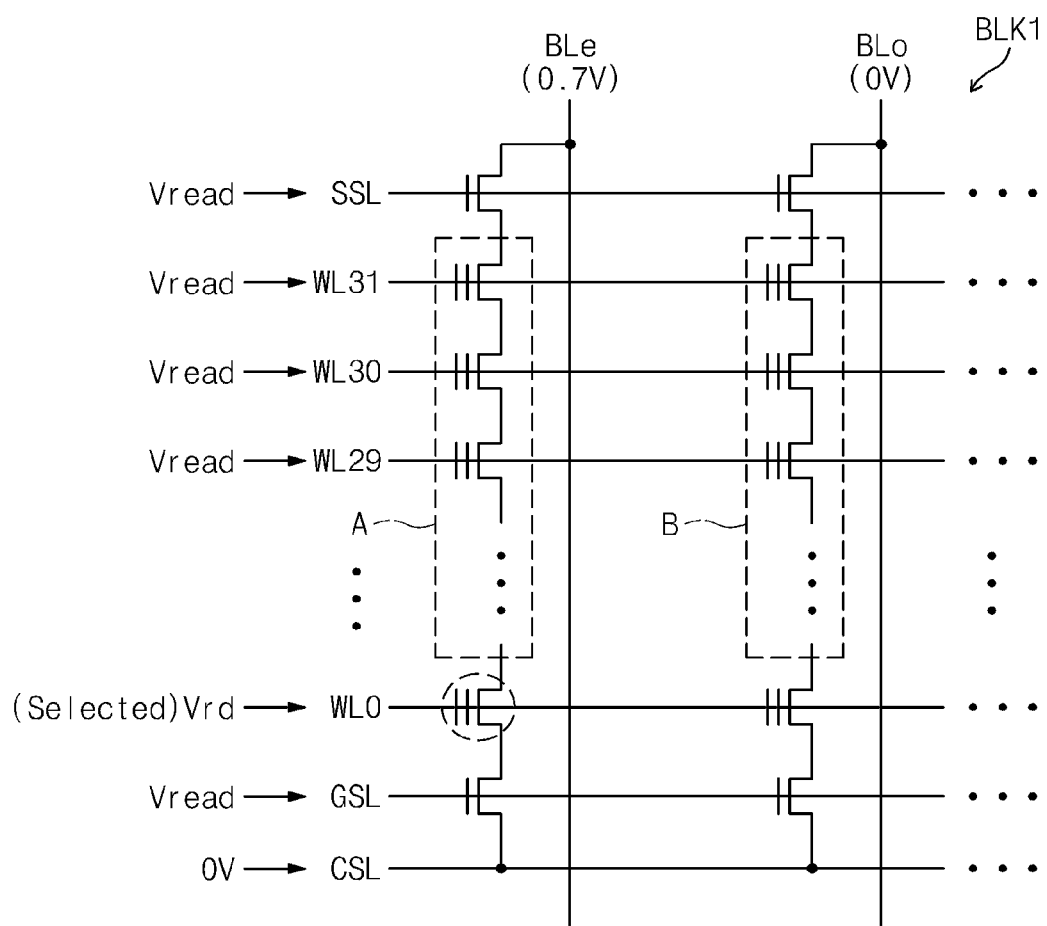
FIG. 3 is a partial circuit diagram of a flash memory device further illustrating a cell string as biased according to an embodiment of the invention.
Figure 4:
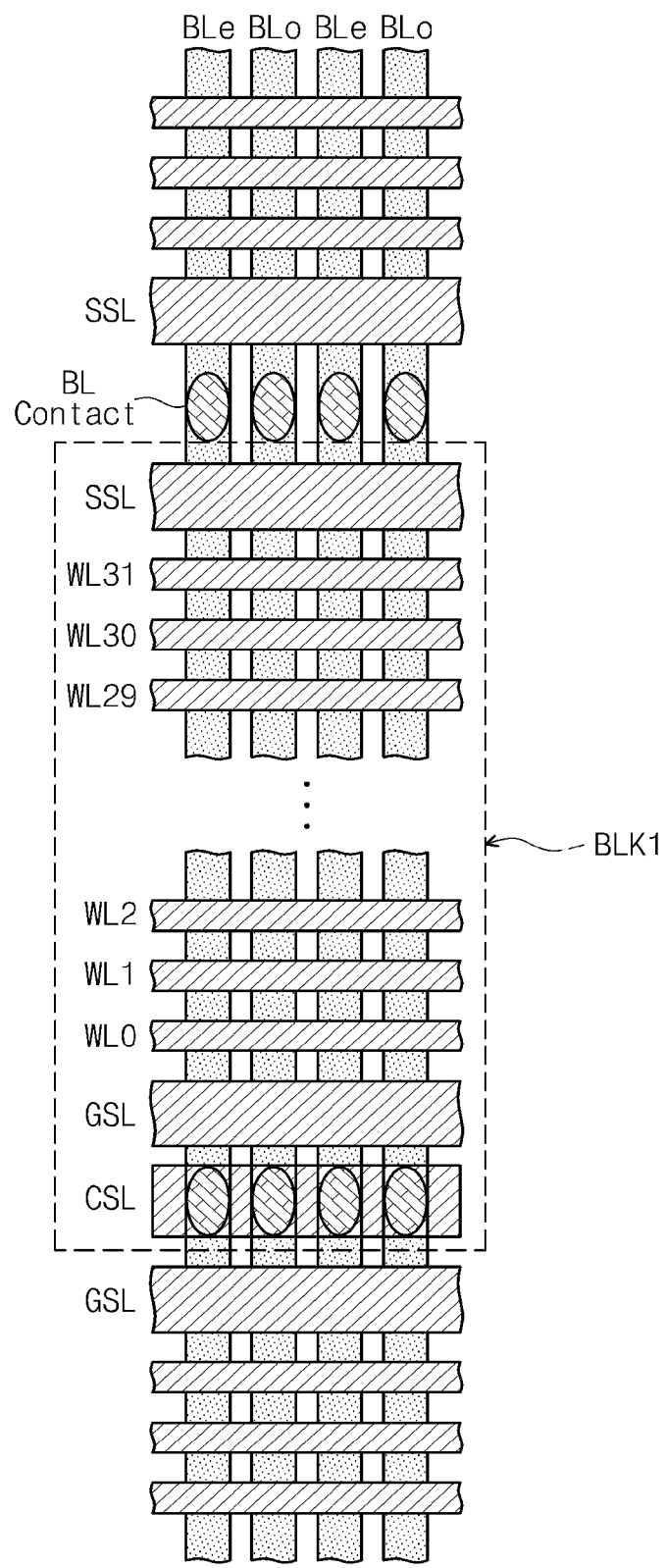
FIG. 4 is a corresponding layout diagram for the cell string shown in FIG. 3.

FIG. 3 is a partial circuit diagram further illustrating a cell string, and FIG. 4 is a corresponding layout diagram for the cell string of FIG. 3.

Referring collectively to FIGS. 3 and 4, a precharge voltage Vpc according to an embodiment of the invention has a level of 1.0V or 0.7V. For instance, a precharge voltage Vpc of 0.7V may be applied to even/selected bit lines BLe. In order to prevent or reduce noise on the even/selected bit lines BLe, 0V is applied to odd/unselected bit lines BLo. In similar form, when the precharge voltage Vpc is applied to the odd/selected bit lines BLo, 0V is applied to the even/unselected bit lines BLe.

For the even and odd bit lines BLe and BLo, the selective read voltage Vrd is applied to the selected word line WL0, while the unselected word lines WL1~WLn-1.

Figure 5:
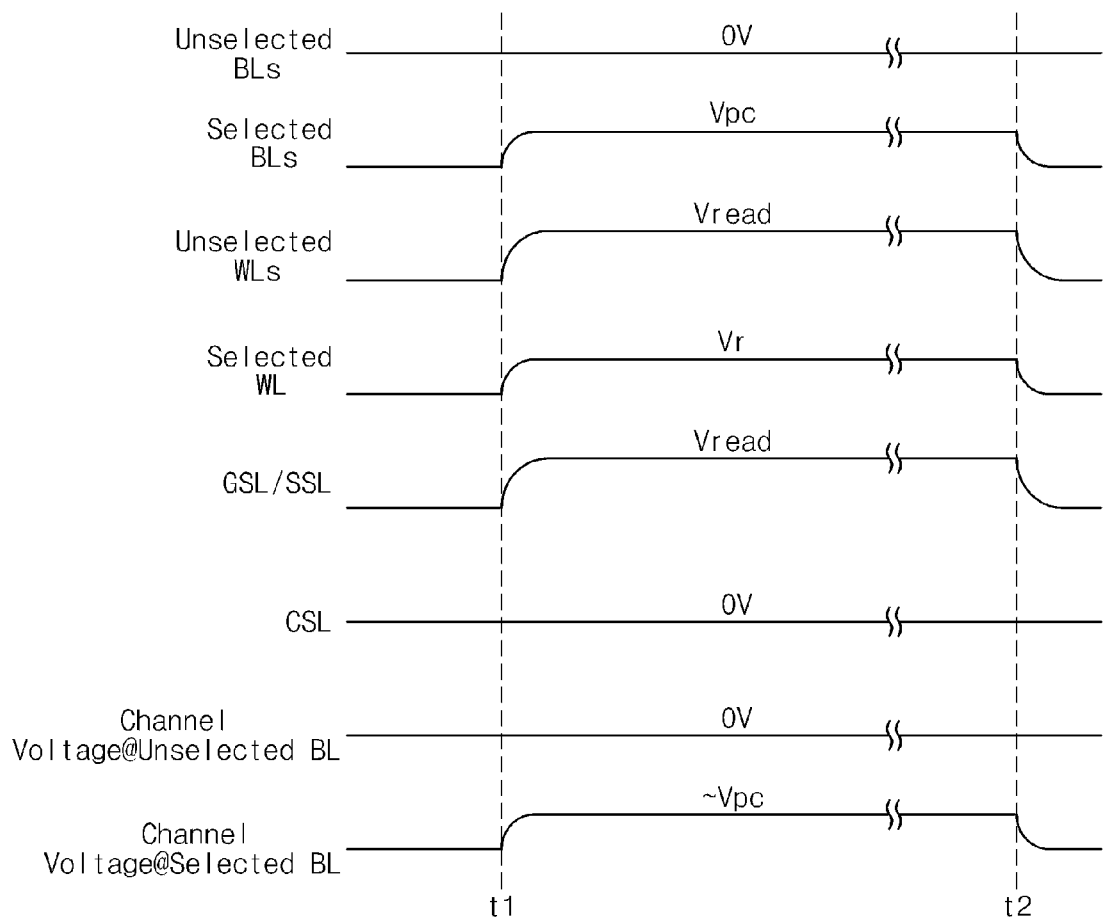
FIG. 5 is a timing diagram for a read operation of the circuit shown in FIG. 3.

FIG. 5 is a timing diagram further illustrating operation of the circuit shown in FIG. 3.

Referring collectively to FIGS. 3 and 5, memory cells coupled to the selected word line WL0 are selected in the even bit line BLe. The precharge voltage Vpc is applied to the even bit line BLe from t1 until t2, while the ground voltage GND or 0V is applied to the odd bit line BLo from t1 until t2. The selective read voltage Vrd is applied to the selected word line WL0 from t1 until t2. The remaining unselected word lines are supplied with the non-selective read voltage Vread from t1 until t2. The non-selective read voltage Vread is also applied to the string and ground selection lines SSL and GSL from t1 until t2. Under these bias conditions, the common source line CSL is connected to ground voltage GND or 0V. The channels of the memory cells in region "B" of FIG. 3 connected to the unselected bit line are charged by ground voltage GND from t1 until t2. The channels of the other memory cells are supplied with the precharge voltage Vpc from t1 until t2.

Figure 6:
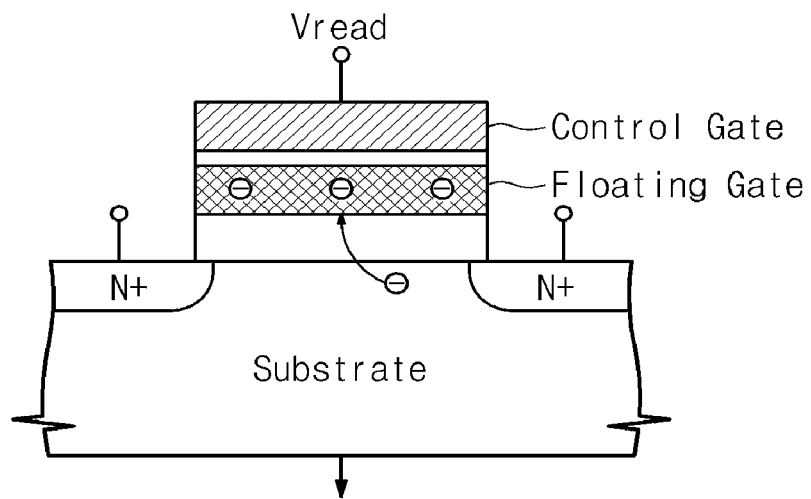
FIG. 6 is a sectional diagram illustrating a soft-programmed effect caused by a read disturbance.

The memory cells, to which the non-selective read voltage Vread is applied, may be softly programmed in part by voltage gaps between the odd bit line BLe and the non-selective read voltage read. Under this bias condition, as shown in FIG. 6, electrons may be injected to the floating gates of the unselected cell transistors from the substrate during the read operation. In other words, the unselected cell transistors having an ON-state (or an erased state) may inadvertently become soft-programmed under the aforementioned bias conditions. This phenomenon is commonly referred to as a 'read disturbance'.

Figure 7:
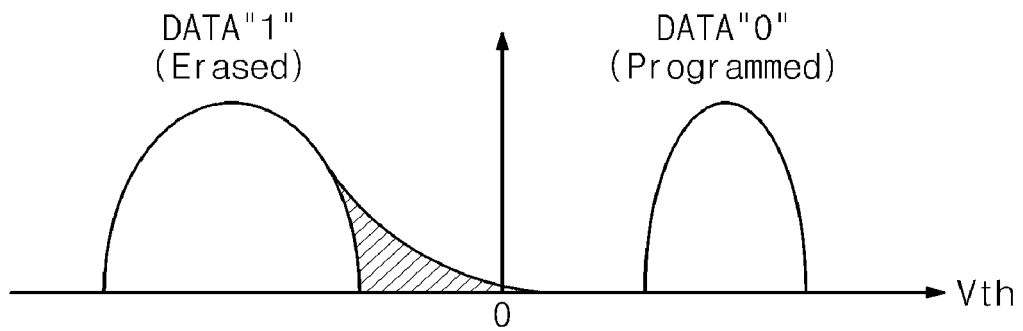
FIG. 7 is a graphic diagram showing exemplary threshold voltage distributions corresponding to ON-cells and OFF-cells.

Such a read disturbance may cause the memory cells having ON-state (or erased state) to exhibit an inappropriately high threshold voltage—as indicated by the hatched portion of the diagram in FIG. 7. This upward migration in threshold voltage for ON-state memory cells tends to increase the number of read cycles required to accurately discriminate the stored data value during a read operation. In some instances, this condition allows normally programmed ON-cells to be read as OFF-cells. That is, the upward migration in threshold voltages due to read disturbance may results in a read failure.

Figure 8:
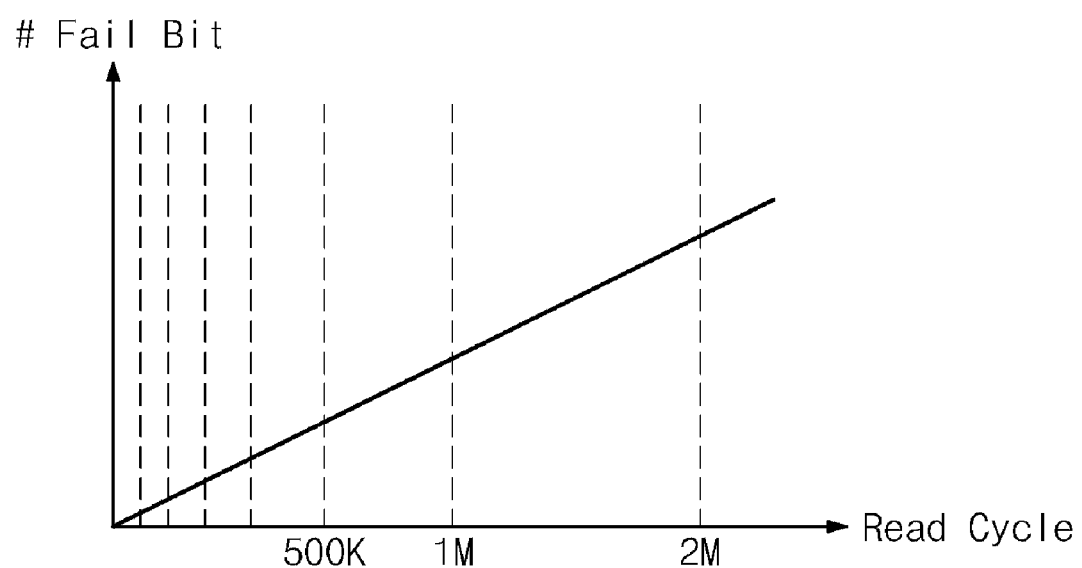
FIG. 8 is a graphic diagram showing a correlation between a number of executed read cycles and read bit failures.

As noted above, many contemporary data systems are able to detect and correct bit errors arising during a read operation. However, as can be seen from the graph of FIG. 8, repeated application of unnecessary read cycles during a read operation will wear the constituent memory cell of a flash memory device. Thus, even where errant data bits can be corrected in the short term, the long term effects of the read disturbance can not be neglected.

It should also be noted that if the number of bit errors (i.e., the bit error count) exceeds a permissible limit, a corresponding memory block may be treated as a bad memory block. Then, the bad memory block is replaced with a spare memory block (or reserved memory block) by way of an additional remedy course known as block replacement mode. Here, the bad block is caused from read disturbance, not being worn out by repetition of the programming and erasing operations. Therefore, such a bad block can be reused by erasing and reforming the bad block. And if several specific pages are repeatedly read in a particular memory block, the read disturbance may cause additional defects in the data page.

For example, when reading a music file from a specific page in an MP3 player, read disturbance may occur because the non-selective read voltage Vread is continuously applied to the rest unselected pages. If there are too may bit errors in the rest unselected pages even though the specific page selected is not involved in an effect of read disturbance, it is impossible to correct the bit error.

Figure 9:
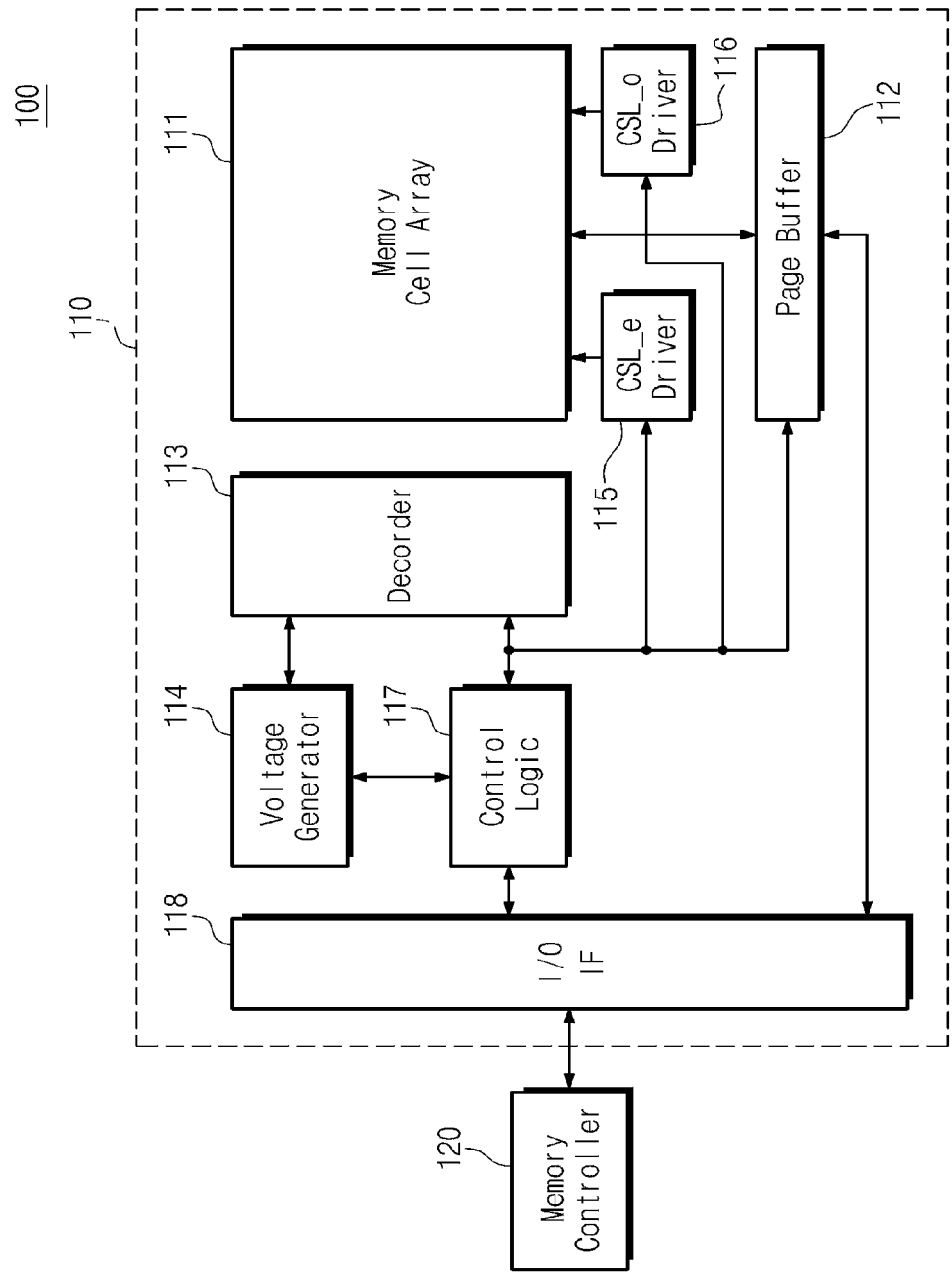
FIG. 9 is a block diagram of a memory system according to an embodiment of the invention.

FIG. 9 is a block diagram of a memory system 100 according to an embodiment of the invention. Referring to FIG. 9, the memory system 100 generally comprises a flash memory device 110 and a memory controller (e.g., a flash controller) 120.

The flash memory device 110 is assumed to be a NAND flash memory device for purposes of the current description. However, the invention is not limited to only flash memory. Indeed, the memory system 100 may include flash memory, magneto-resistive random-access memory (MRAM), and/or resistive RAM (RRAM).

As illustrated in FIG. 9, the flash memory device 110 includes a memory cell array 111 configured to store M-bit data, where M is an integer greater than 0). The memory cell array 111 may be divided into a plurality of data regions or sectors. Those regions may include data fields for storing payload (of "normal") data as well as spare fields. The various fields within the memory cell array 111 may be organized into or among a plurality of memory blocks. The definition and/or formation of memory blocks is well known in the art and will not be further described herein.

The flash memory device 110 according to an embodiment of the invention further comprises a page buffer 112, a decoder 113, a voltage generator 114, an even common-source-line (CSL_e) driver 115, an odd common-source-line (CSL_e) driver 116, a control logic circuit 117, and a input/output interface circuit 118. The page buffer 112 is configured to read/program data from/into the memory cell array 111 by the control circuit 117. The decoder 113 operates by the control logic circuit 113, being configured to select a memory block from the memory cell array 111 and select a word line from a selected memory block. A selected word line is driven with a word line voltage provided from the voltage generator 114. The voltage generator 114 operates under the control of the control logic circuit 117 which is configured to generate the word line voltage (e.g., read voltage, program voltage, pass voltage, verifying voltage, etc.). The even CSL driver 115 is connected to a cell string of the even bit line and controls the voltage applied to the even bit line. The odd CSL driver 116 is connected to a cell string of the odd bit line and controls the voltage applied to the odd bit line. The control logic circuit 117 is configured to control the overall operation of the flash memory device 100.

The memory controller 120 according to an embodiment of the invention is configured to control the flash memory device 110 in response to various commands received from an external device (e.g., a host). Although not shown, it is well known in the art that the memory controller 120 may include a processing unit such as central processing unit (CPU) or microprocessor, error check/correction (ECC) circuit, buffer memory, and so on. According to certain embodiments of the invention, the memory controller 120 is configured to prevent the effects of soft-programming by particularly controlling CSL voltages applied to the even and odd bit lines.

This result is described in relation to an embodiment of the invention illustrated in FIGS. 10 through 14.

Figure 10:
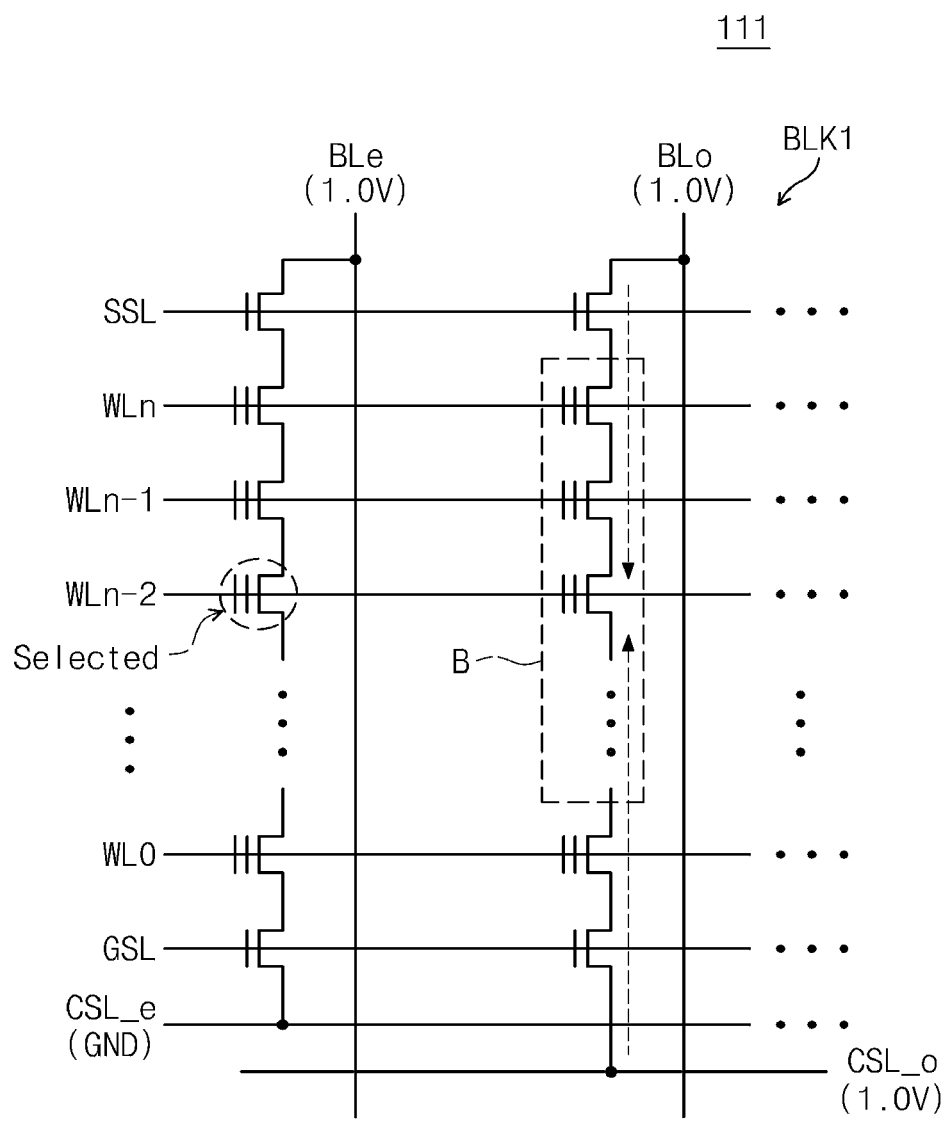
FIG. 10 is a partial circuit diagram of memory cells according to an embodiment of the invention.
Figure 11:
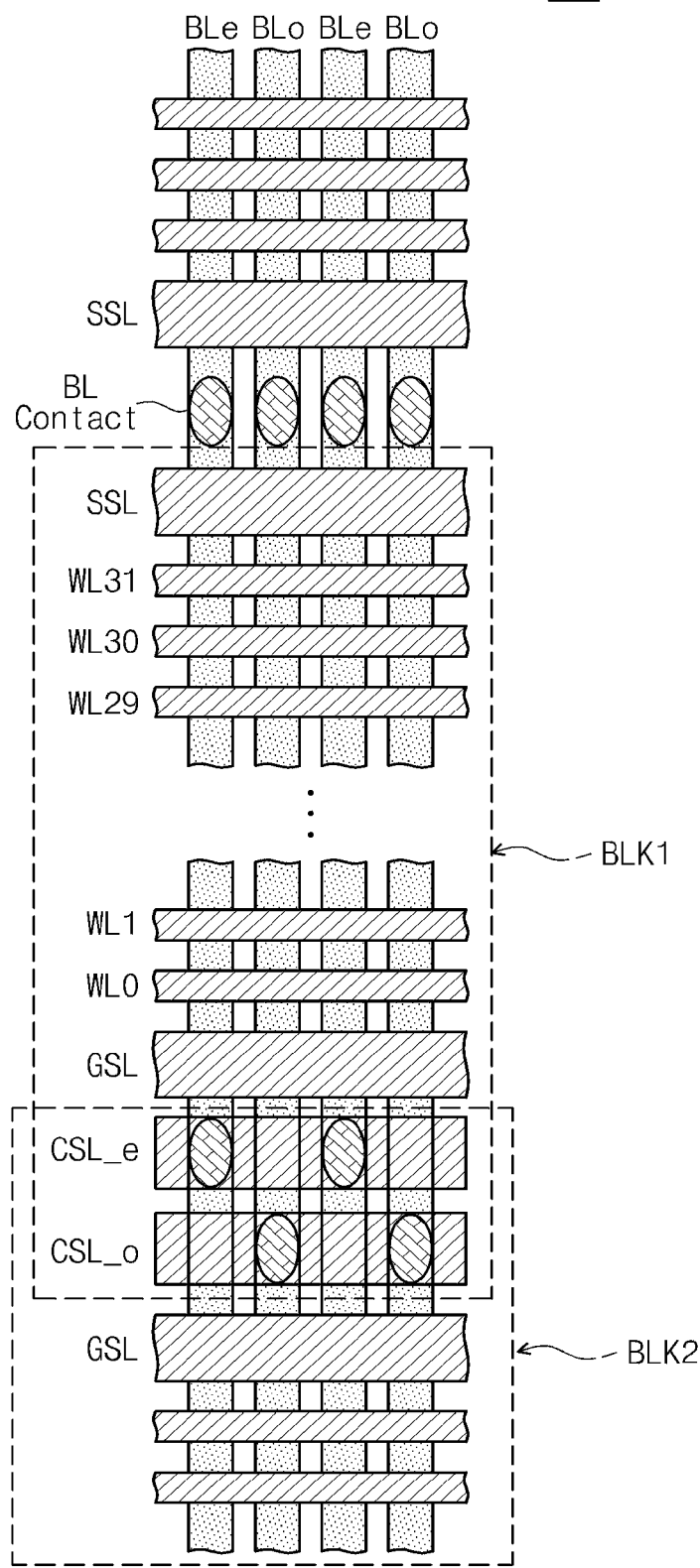
FIG. 11 is a corresponding layout diagram for the circuit shown in FIG. 10.

FIG. 10 is a partial circuit diagram of memory cells according to an embodiment of the invention, and FIG. 11 is a corresponding layout diagram of the circuit shown in FIG. 10.

Referring to FIG. 10, a precharge voltage Vpc according to the illustrated embodiment of the invention ranges between 1.0V and 0.7V. In this embodiment, there are arranged an even common source line CSL_e connected to the even bit lines and an odd common source line CSL_o connected to the odd bit lines. A precharge voltage Vpc of 1.0V is applied to an even/selected bit line BLe and an odd/unselected bit line BLo. For the even and odd bit lines BLe and BLo, the selective read voltage Vrd is applied to a selected word line while the non-selective read voltage Vread is applied to unselected word lines. The memory cells located in region "B" to which the non-selective read voltage Vread is applied can be protected from the effects of soft programming by a decreased voltage gap between the odd bit line BLo and the non-selective read voltage Vread.

Referring to FIG. 11, the even common source line CSLe contacts to the even bit lines BLe, while the odd common source line CSLo contacts to the odd bit lines BLo. The even and odd common source lines CSLe and CSLo are connected between the ground selection lines GSL of the first and second blocks BLK1 and BLK2, and shared by the first and second blocks BLK1 and BLK2.

Figure 12:
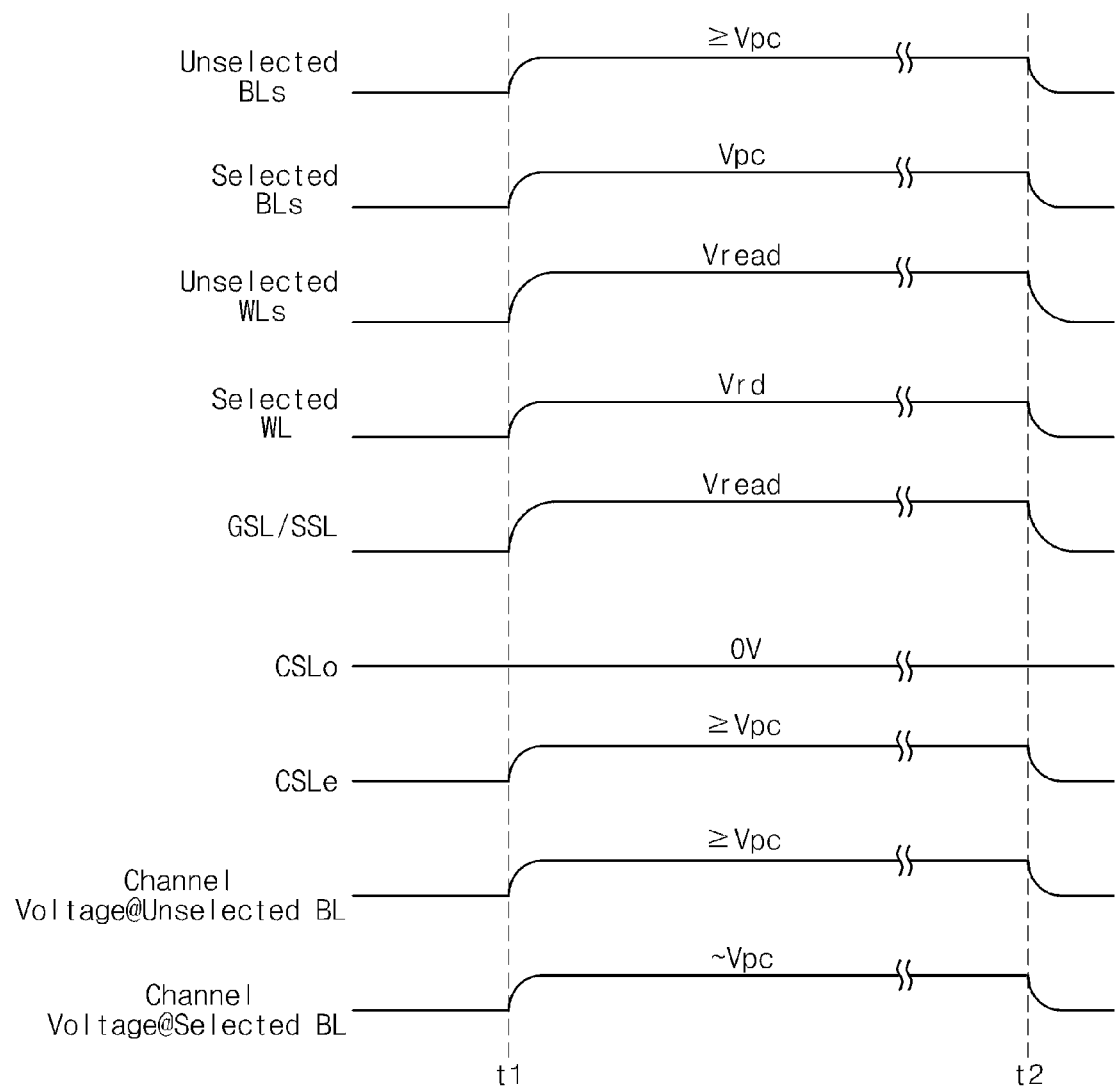
FIG. 12 is a timing diagram showing operation of the circuit shown in FIG. 10.

FIG. 12 is a timing diagram further illustrating the operation of the circuit shown in FIG. 10.

Referring to FIGS. 10 and 12, an example is assumed wherein a memory cell coupled to the word line WLn-2 in the even bit line BLe is selected.

To the even bit line BLe, a voltage equal to or higher than the precharge voltage Vpc is applied during the interval t1 to t2. To the odd bit line BLo is applied the precharge voltage Vpc from t1 to t2. The selective read voltage Vrd is applied the selected word line WLn-2 from t1 to t2. To the remaining/unselected word lines is applied the non-selective read voltage Vread from t1 to t2. The non-selective read voltage is also applied to the string and ground selection lines SSL and GSL from t1 to t2.

To the odd common source line CSLo is applied the ground voltage or 0V, while a voltage equal to or higher than the precharge voltage Vpc is applied to the even common source line CSLe from t1 to t2. During this, a voltage equal to or higher than the precharge voltage Vpc is charged to the channels of the memory cells B of the unselected bit line from t1 to t2. The channels of the memory cells of the selected bit line are charged with the precharge voltage Vpc from t1 until t2.

Figure 13:
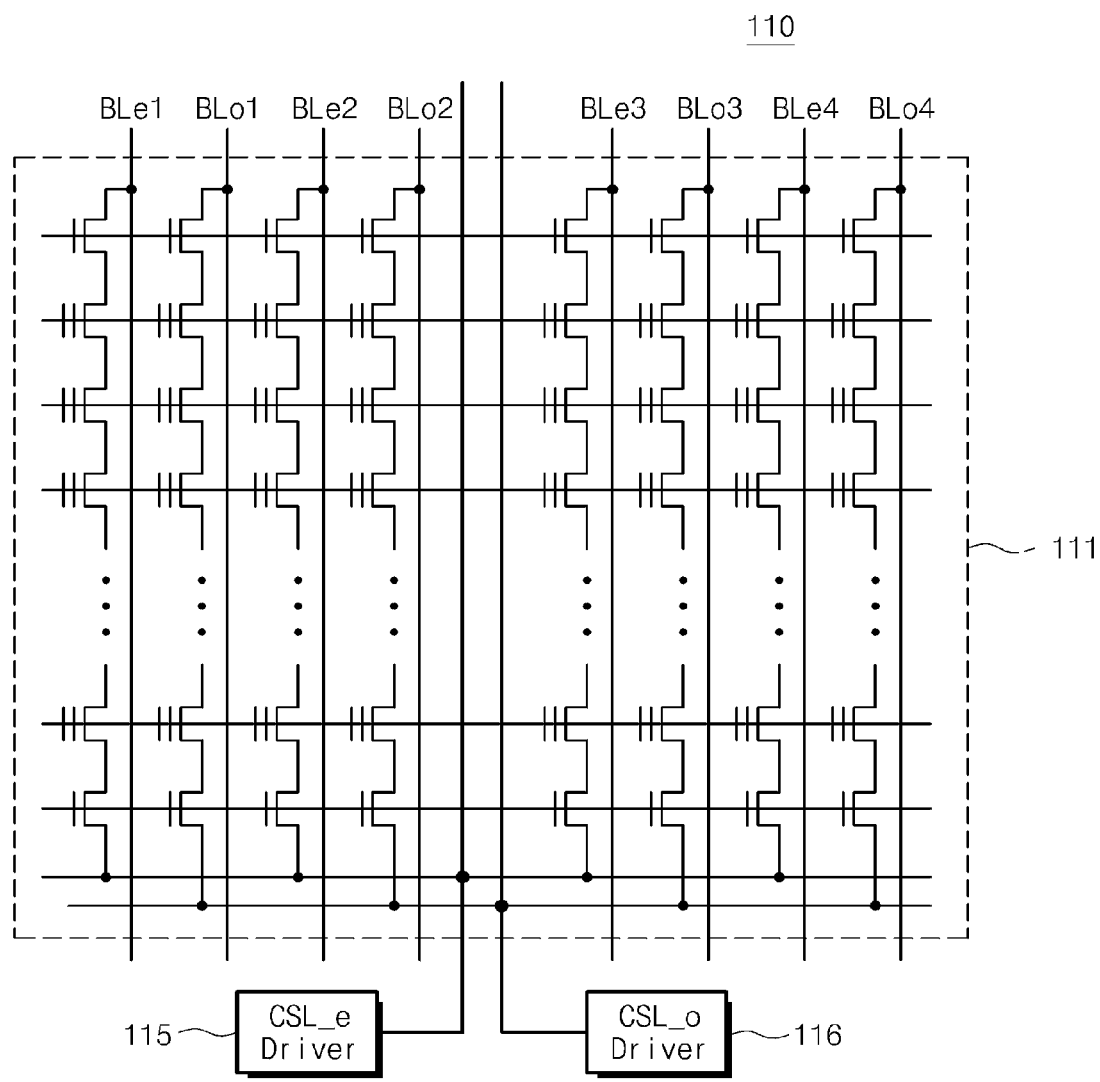
FIG. 13 is a partial circuit diagram further illustrating a common source line according to an embodiment of the invention.
Figure 14:
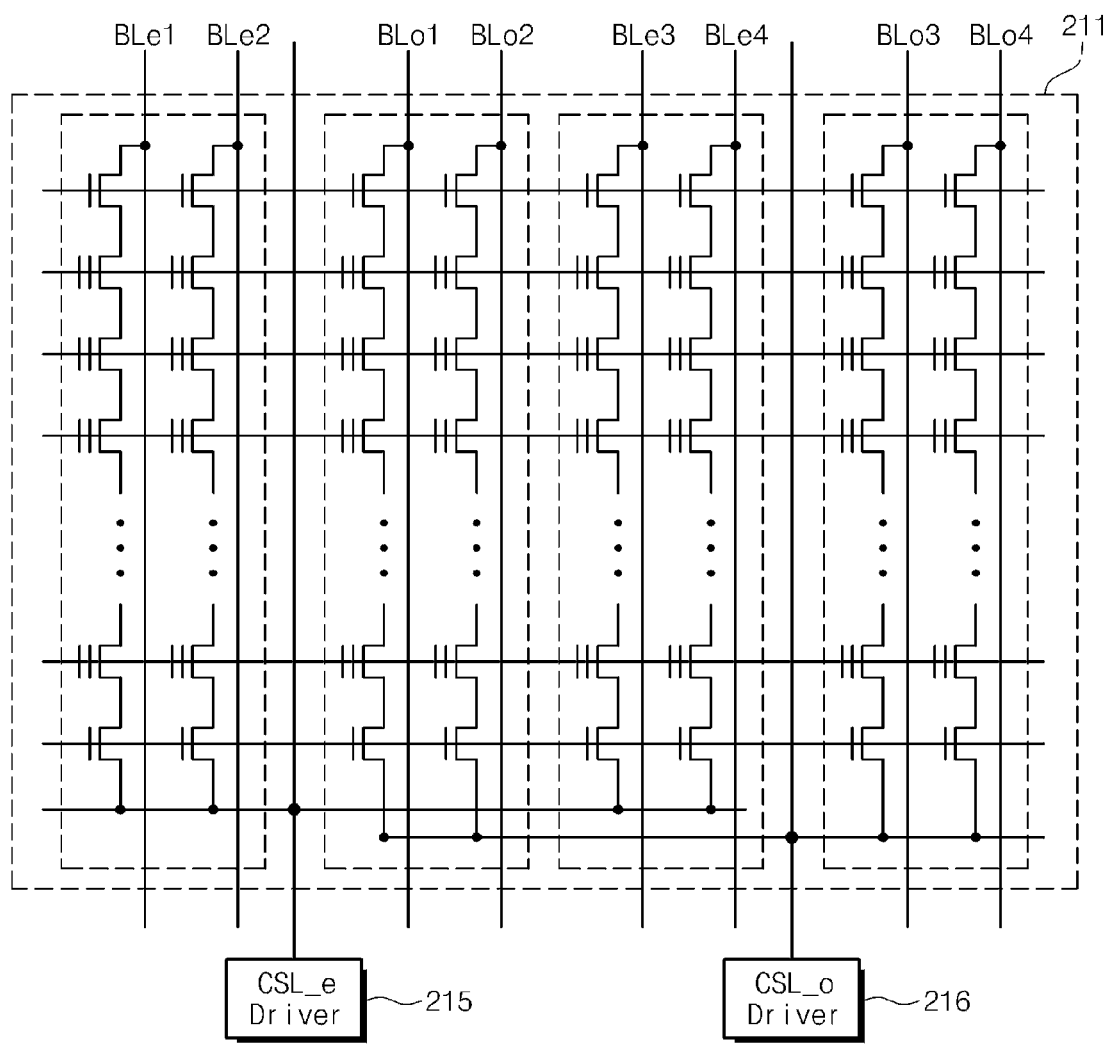
FIG. 14 is a partial circuit diagram further illustrating a common source line associated with another embodiment of the invention.

As shown in FIG. 13, the memory cell array 110 is formed by alternately arranging even and odd cell strings. Further, as shown in FIG. 14, the memory cell array 210 is formed by alternately arranging paired even and odd cell strings. The memory cell arrays 110 and 210, shown in FIGS. 13 and 14, comprise cell strings in the same well.

Figure 15:
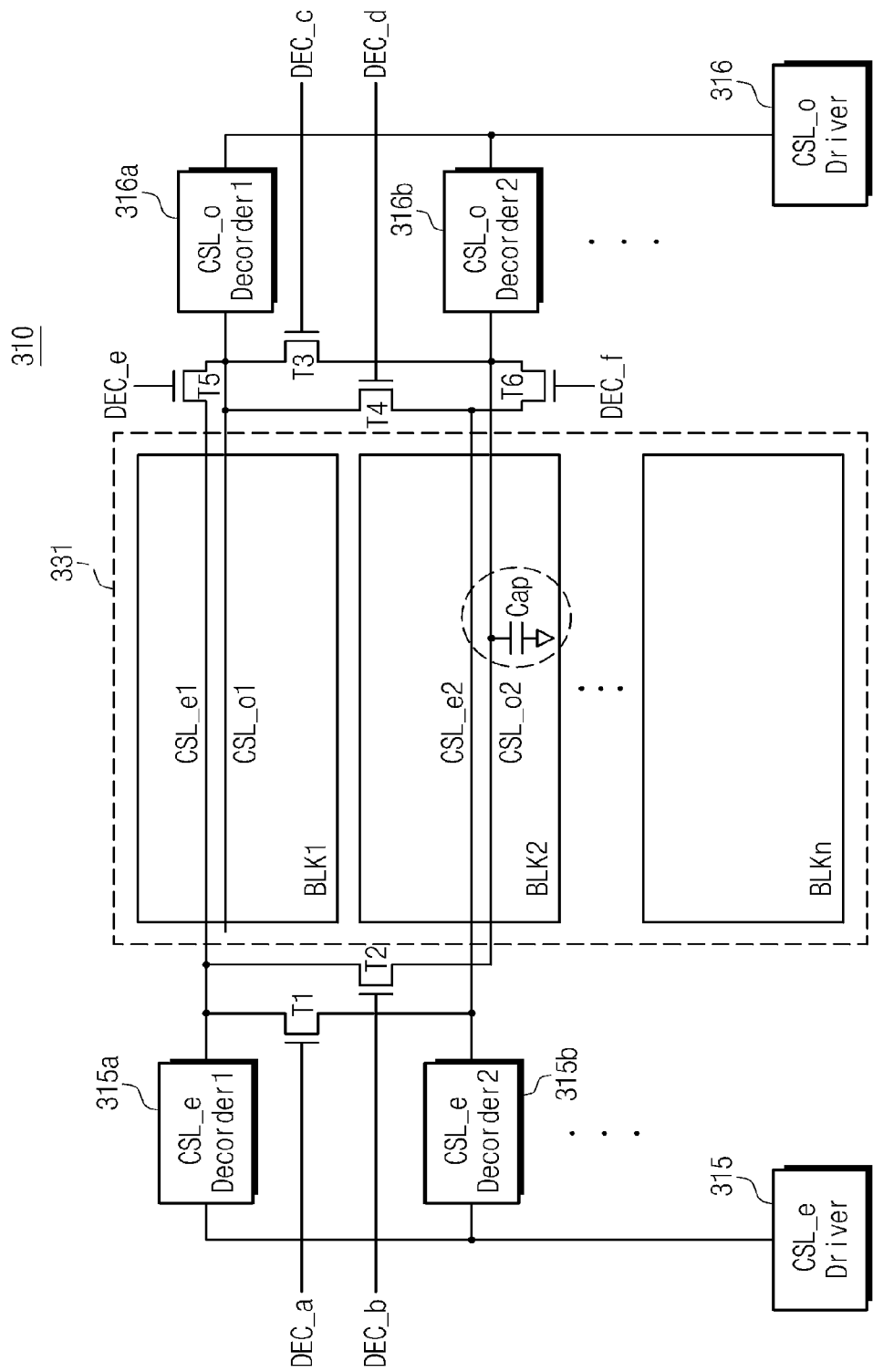
FIG. 15 is a block diagram of a flash memory device according to yet another embodiment of the invention.

FIG. 15 is a block diagram of a flash memory device 310 according to another embodiment of the invention.

Referring to FIGS. 9 and 15, the flash memory device 310 comprises first and second even-CSL (CSL_e) decoders 315a and 315b, first and second odd-CSL (CSL_o) decoders 316a and 316b, first through sixth transistors T1~T6 for connecting those even and odd-CSL decoders, an even CSL driver 315, and an odd CSL driver 316.

The even CSL driver 315 controls the first and second even-CSL decoder 315a and 315b to supply into the even common source lines CSLe1 and CSLe2 of each block. The first even-CSL decoder 315a supplies the even common source line CSL_e1 of a first block with the ground voltage or a predetermined voltage. The second even-CSL decoder 315b supplies the even common source line CSL_e2 of a second block with the ground voltage or a predetermined voltage.

The odd CSL driver 316 controls the first and second odd-CSL decoder 316a and 316b to supply into the odd common source lines CSLo1 and CSLo2 of each block. The first odd-CSL decoder 316a supplies the odd common source line CSL_01 of a first block with the ground voltage or a predetermined voltage. The second odd-CSL decoder 316b supplies the odd common source line CSL_02 of a second block with the ground voltage or a predetermined voltage.

The first transistor T1 is connected between the first and second even common source lines CSL_e1 and CSL_e2, being controlled by a signal DEC_a. The second transistor T2 is connected between the first even common source line CSL_e1 and the second odd common source line CSL_o2, being controlled by a signal DEC_b. The third transistor T3 is connected between the first and second odd common source lines CSL_o1 and CSL_o2, being controlled by a signal DEC_c. The fourth transistor T4 is connected between the first odd common source line CSL_o1 and the second even common source line CSL_e2, being controlled by a signal DEC_d. The fifth transistor T5 is connected between the first odd common source line CSL_o1 and the first even common source line CSL_e1, being controlled by a signal DEC_e. The sixth transistor T6 is connected between the second odd common source line CSL_o2 and the second even common source line CSL_e2, being controlled by a signal DEC_f.

For instance, in the memory cell array 311 according to this embodiment of the present invention, it is assumed that the second block BLK1 is selected while the rest of the blocks are being unselected. During a read operation to the even cell strings of the second block BLK2, ground voltage GND is applied to the first even and odd common source lines CSL_e1 and CSLo1, ground voltage GND is applied to the second even common source line CSL_e2, and a predetermined voltage is applied to the second odd common source line CSL_o1. The predetermined voltage in one embodiment of the invention is 1.0V.

If the first, fourth, and fifth transistors T1, T4, and T4 are turned ON while the second, third, and sixth transistors T2, T3, and T6 are turned OFF, the first even common source line CSL_e1 is connected to the second even common source line CSL_e2. If the first even common source line CSL_e1 is connected to the second even common source line CSL_e2, parasitic capacitance of the second even common source line CSL_e2 becomes larger in value. Further, the second odd-CSL decoder 316b makes the predetermined voltage (i.e., the precharge voltage Vpc) only applied to the second odd common source line CSL_o1. The even and odd-CSL drivers 315 and 316 are connected to the even and odd common source lines of all blocks through the decoders 315a, 315b, 316a, and 316b. The decoders 315a~316b are controlled to drive the even or odd-CSL driver of a selected block in order to reduce power consumption by the even and odd-CSL drivers 315 and 316.

According to certain embodiments of the invention, an increase of the parasitic capacitance on the second even common source line CSL_e2 acts to lessen the effect of noise arising during a read operation to the even cell string of the second block BLK2. Moreover, embodiments of the invention offer the advantage of preventing errors caused by read disturbance when repeatedly reading data from a specific page.

Flash memory devices are one type of nonvolatile memory capable of retaining stored data in the absence of applied power. With increasing use of mobile apparatuses such as cellular phones, personal digital assistants (PDA), digital cameras, portable gaming consoles, and MP3, flash memory has become widely employed to store code storage, amongst other uses. Flash memory is also widely used in home applications such as high-definition televisions (HDTV), digital versatile disks (DVD), routers, and global positioning systems (GPS).

Figure 16:
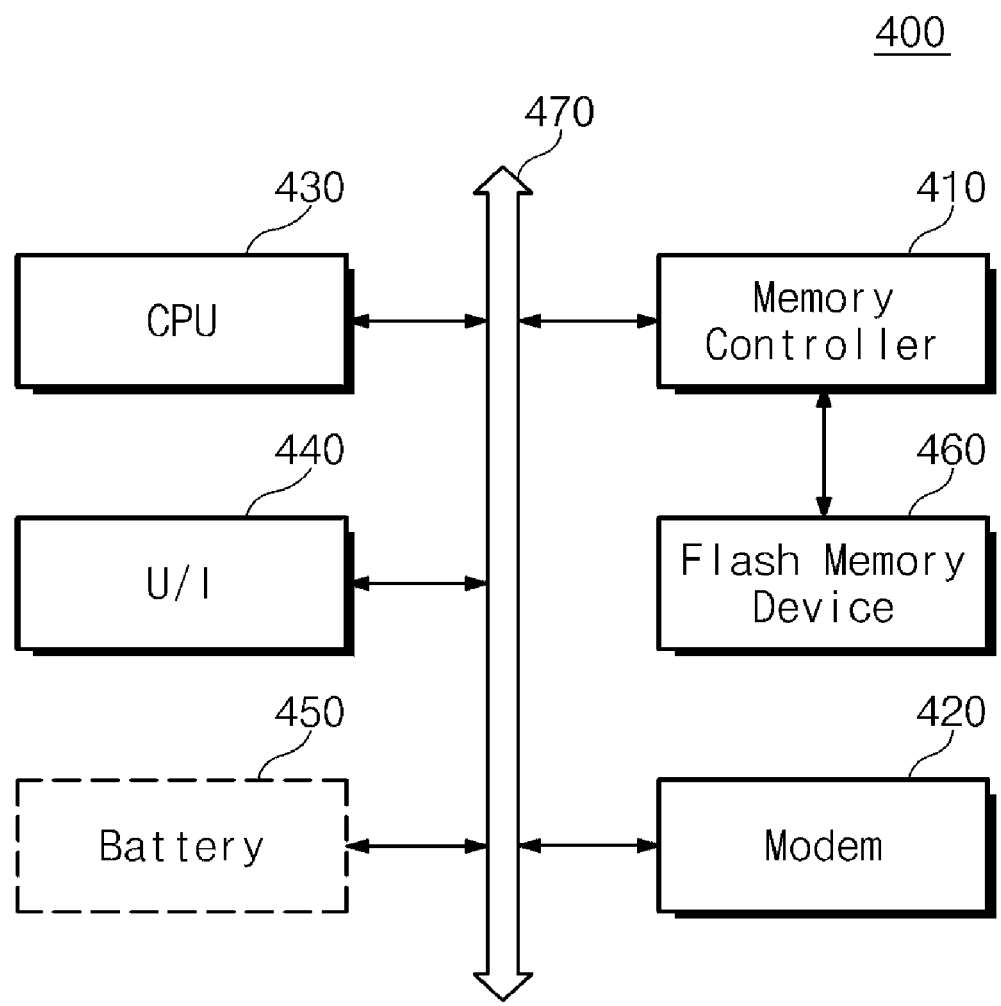
FIG. 16 is a general block diagram of a computational system including a memory system according to an embodiment of the invention.

A block diagram of a computational system—generally modeling any number of host devices—and including flash memory device according to an embodiment of the invention is illustrated in FIG. 16. The computational system 400 is organized around a microprocessor (CPU) 430, and includes a user interface 440, a modem 420 such as a baseband chipset, a memory controller 410, and a flash memory device 460, all of which are connected to each other by way of a bus 470. The memory controller 410 operates to control the flash memory device 460. In the flash memory device 460, N-bit data, where N is a positive integer, processed or to be processed by the CPU 430 may be stored through the memory controller 410. If the computational system 400 shown in FIG. 16 is a mobile apparatus, it may further comprise a battery 450 for supplying power.

Although not shown in FIG. 16, the computational system 400 may be further equipped with an application chipset, a camera image processor (e.g., complementary metal-oxide-semiconductor (CMOS) image sensor; i.e., CIS), a mobile DRAM, etc. The memory controller 410 and the flash memory device 460, for example, are able to constitute a solid state drive/disk (SSD) using a nonvolatile memory for storing data. An exemplary SSD is disclosed in U.S. Patent Publication No. 2006-0152981, the subject matter of which is hereby incorporated by reference. The memory controller 410 and the flash memory device 460 may also form a memory card using a nonvolatile memory for storing data.

Figure 17:
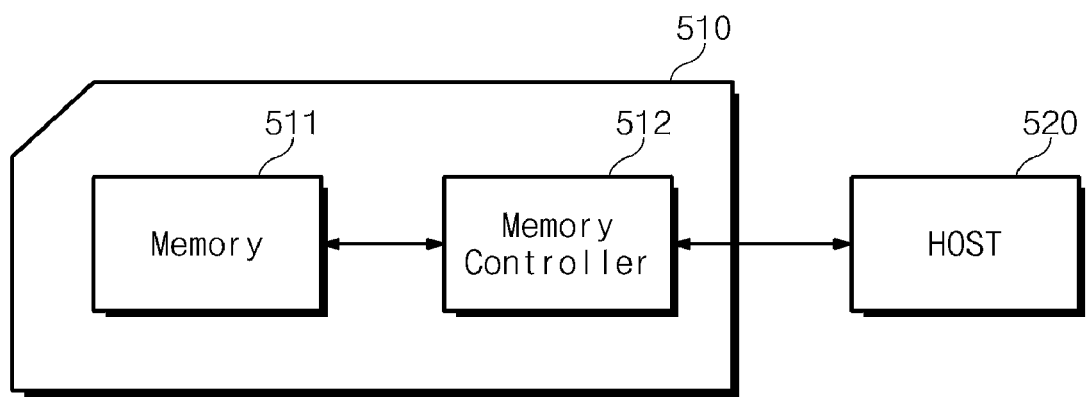
FIG. 17 is a general block diagram of a memory-based storage system according to an embodiment of the invention.

FIG. 17 is a block diagram of a memory-based storage system according to an embodiment of the invention.

The memory-based storage unit 500 shown in FIG. 17 may be implemented in a form of card by including a memory 511 and a memory controller 512. For instance, the card 500 may be a card adaptable to an industrial standard for using electronic apparatuses such as digital cameras, personal computers, and so on. Additionally, it can be seen that the memory controller 512 is able to control the memory 511 in response to control signals received from a host 520 by the card 300.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the invention is to be determined by the broadest permissible interpretation of the following claims and their equivalents.

What is claimed is:

1. A nonvolatile memory device comprising:
a memory cell array comprising a memory block including a plurality of first cell strings connected to respective even bit lines and a plurality of second cell strings connected to respective odd bit lines, the first and second cell strings alternately situated in the memory block;
a first common source line connected to the first cell strings of the memory block;
a second common source line connected to the second cell strings of the memory block; and
a control logic circuit configured to independently control the first and second common source lines.

2. The device of claim 1, wherein the control logic circuit is further configured to apply a predetermined voltage to the second common source line while reading a memory cell connected to one of the plurality of first cell strings.

3. The device of claim 1, further comprising:
a first ground selection transistor associated with the first cell strings and having a source connected to the first common source line; and
a second ground selection transistor associated with the second cell strings and having a source connected to the second common source line.

4. The device of claim 3, wherein during a read operation directed to a selected memory cell connected to a selected word line of the first cell strings, a ground voltage is applied to the first common source line and a predetermined voltage is applied to the second common source line.

5. The device of claim 3, wherein during a read operation directed to a selected memory cell connected to a selected word line of second cell strings, a ground voltage is applied to the second common source line and a predetermined voltage is applied to the first common source line.

6. The device of claim 3, wherein the second common source line of the first memory block is supplied with a predetermined voltage.

7. The device of claim 2, wherein the predetermined voltage is a precharge voltage.

8. The device of claim 1, wherein the memory cell array is configured as a flash memory, PRAM, MRAM, or RRAM.

9. A nonvolatile memory device comprising:
a memory cell array including a first cell string connected between a first bit line and a first common source line, and a second cell string a second common source line and a second bit line adjacent to the first bit line;
a control logic circuit configured to independently control the first and second common source lines,
a first ground selection transistor associated with the first cell string and having a source connected to the first common source line; and
a second ground selection transistor associated with the second cell string and having a source connected to the second common source line,
wherein the first cell string is an even cell string and the second cell string is an odd cell string,
wherein the memory cell array comprises a plurality of memory blocks, wherein each memory block includes the first and second common source lines, and, wherein during a read operation directed to a selected memory cell of the first cell string in a first memory block in the plurality of memory blocks, the first common source line of the first memory block is connected to the first common source line of remaining memory blocks, other than the first memory block, in the plurality of memory blocks
wherein the first and second common source lines are disposed between gate lines of ground selection transistors for adjacent memory blocks in the plurality of memory blocks, and the first and second common source lines are shared by the adjacent memory blocks.

10. The device of claim 9, further comprising:
a first common source line driver configured to drive the first common source line; and
a second common source line driver configured to drive the second common source line,
wherein the control logic circuit is further configured to independently control the first and second common source line drivers.

* * * * *